United States Patent
Bloom et al.

(10) Patent No.: US 9,910,729 B1
(45) Date of Patent: Mar. 6, 2018

(54) RESTORING ECC SYNDROME IN NON-VOLATILE MEMORY DEVICES

(71) Applicant: Cypress Semiconductor Corporation, San Jose, CA (US)

(72) Inventors: Ilan Bloom, Haifa (IL); Amichai Givant, Rosh Ha'Ayin (IL); Yoav Yogev, Mazkeret Batya (IL); Amit Shefi, Givatayaim (IL)

(73) Assignee: Cypress Semiconductor Corporation, San Jose, CA (US)

( * ) Notice: Subject to any disclaimer, the term of this patent is extended or adjusted under 35 U.S.C. 154(b) by 164 days.

(21) Appl. No.: 14/799,455

(22) Filed: Jul. 14, 2015

Related U.S. Application Data (63) Continuation of application No. 13/860,542, filed on Apr. 11, 2013, now Pat. No. 9,081,710.

(51) Int. Cl.
  G06F 11/10     (2006.01)
  G11C 29/52     (2006.01)
  G06F 3/06      (2006.01)

(52) U.S. Cl.
  CPC .......... *G06F 11/1068* (2013.01); *G06F 3/064* (2013.01); *G06F 3/0619* (2013.01); *G06F 3/0644* (2013.01); *G06F 3/0652* (2013.01); *G06F 3/0679* (2013.01); *G11C 29/52* (2013.01)

(58) Field of Classification Search
  CPC ....................................................... G06F 11/10
  USPC ........................................ 714/764, 758, 773
  See application file for complete search history.

(56) References Cited

U.S. PATENT DOCUMENTS

| 7,634,585 B2 * | 12/2009 | Conley .............. G06F 12/0866 710/1 |
| 8,166,371 B2 | 4/2012 | Shimizume et al. |
| 2006/0156189 A1 | 7/2006 | Tomlin |
| 2007/0280002 A1 * | 12/2007 | Sudhindra Prasad .............. G11C 16/3418 365/185.29 |
| 2008/0109705 A1 | 5/2008 | Pawlowski et al. |
| 2010/0202203 A1 | 8/2010 | Choi et al. |
| 2010/0205504 A1 | 8/2010 | Fung et al. |
| 2011/0078544 A1 | 3/2011 | Gruner et al. |
| 2011/0209028 A1 | 8/2011 | Post et al. |
| 2012/0159281 A1 | 6/2012 | Shalvi et al. |
| 2014/0219018 A1 * | 8/2014 | Kalderon ............. G11C 16/102 365/185.03 |

OTHER PUBLICATIONS

International Search Report for International Application No. PCT/IB14/60643 dated Nov. 5, 2014; 4 pages.
USPTO Non-Final Rejection for U.S. Appl. No. 13/860,542 dated Nov. 20, 2014; 6 pages.
USPTO Notice of Allowance for U.S. Appl. No. 13/860,542 dated Mar. 30, 2015; 5 pages.
Written Opinion of the International Searching Authority for International Application No. PCT/IB14/60643 dated Nov. 5, 2014; 5 pages.

* cited by examiner

*Primary Examiner* — Fritz Alphonse (57) ABSTRACT

A method of restoring an ECC syndrome in a non-volatile memory device having memory cells arranged in a plurality of sectors within a memory cell array, the method comprising identifying a first sector including at least one page having a disabled ECC (error correction code) flag; reading the value of all data bits in said at least one page; calculating values for ECC bits in said at least one page; and writing said data bit values and said calculated ECC bit values to a second sector in the memory cell array.

20 Claims, 5 Drawing Sheets

RESTORING ECC SYNDROME IN NON-VOLATILE MEMORY DEVICES

This application is a Continuation Application of U.S. patent application Ser. No. 13/860,542, filed Apr. 11, 2013, now U.S. Pat. No. 9,081,710, Issued Jul. 14, 2015, which is incorporated by reference herein its entirety.

FILED OF INVENTION

The present invention relates to non-volatile memory devices generally and to a method for restoring an invalidated ECC syndrome in non-volatile memory devices in particular.

BACKGROUND OF THE INVENTION

Non-volatile memory devices such as, for example FLASH memory devices, may include an array of memory cells divided into a number of sectors. Each sector may include a large number of bits which may number into the millions, for example, 1 million bits or even two million bits, or more. The bits may be arranged into pages where each page includes data bits for storing user information and ECC (error correcting code) bits corresponding to an ECC syndrome for protecting the user information by for error correction. Use of the EEC bits substantially ensures that the stored user information, when read, is the same as that which was written to memory. A typical sector in a memory device may have hundreds, and in some cases, thousands of pages.

Non-volatile memory devices may be subject to program-on-program operations. These type of operations generally include overwriting one or more data bits on a page that already includes some programmed bits in it, while the ECC syndrome for the page is left unchanged. Consequently, the ECC syndrome in the changed page may no longer be valid and is unable to protect the data in the page (the page may be considered to be unprotected). Furthermore, as the unprotected page is included in a sector, the sector may also be considered to be unprotected.

A sector is typically programmed by writing onto the pages one page at a time. This allows the user to write onto only one page, if so desired. Erasing, on the other hand, generally requires that all pages in the sector be erased. Consequently, a user wishing to erase only one page must erase all the pages and then rewrite the erased information onto all the pages except that intended to be erased.

Non-volatile memory devices are generally limited to a maximum number of program/erase (P/E) cycles. This represents the maximum number of times a sector may be programmed and erased in a device (may also be referred to as maximum number of erase cycles, or maximum ECN, erase cycle number). Once a sector reaches the maximum number of P/E cycles, the device is considered to have reached "end-of-life" and may be considered unreliable, at which point it is generally discarded. This is of particular importance when data is continuously written to a same sector in a memory device as the maximum number of P/E cycles is quickly reached, shortening the lifetime of the device.

Wear-leveling is a process used for increasing the lifetime of non-volatile memories by storing data in a manner so that sector ECN is distributed more evenly across the different sectors of a memory array. These algorithms generally serve to remap logical-sector addresses to different physical-sector addresses in the array in what is frequently referred to as "address swapping". The algorithms may include tracking least used sectors to identify next areas where data may be written into the array. The algorithms may also include tracking sectors to detect conditions which may trigger wear-leveling events associated with high P/E cycling. This process may reduce or even eliminate single sector failures resulting from a high concentration of P/E cycles in a limited number of sectors.

Figure 1:
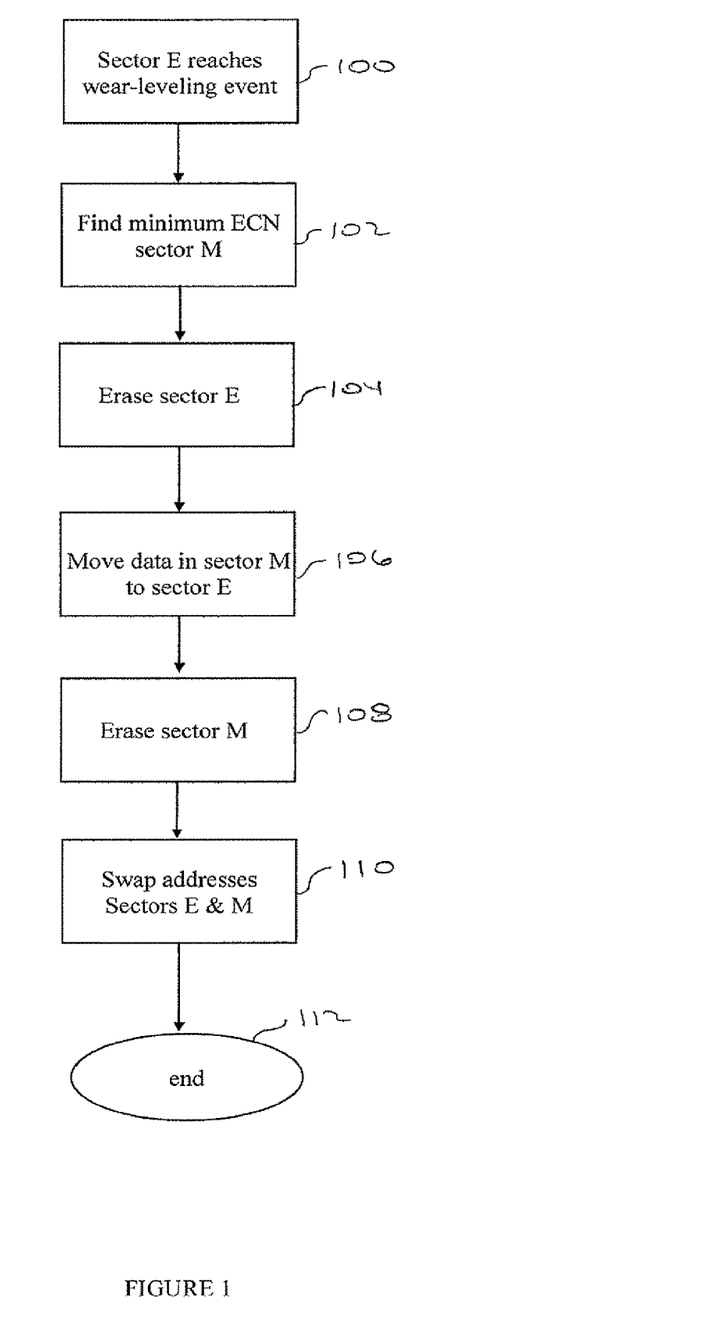
FIG. 1 is a flow chart of an exemplary known wear-leveling algorithm for non-volatile memory devices.

Reference is made to FIG. 1 which is a flow chart of an exemplary known (prior art) wear-leveling algorithm for non-volatile devices and includes address swapping.

At a step 100, a wear-leveling event is detected in a sector of a memory array in a non-volatile memory device, for example a sector E. The wear-leveling event may be associated with sector E reaching a predetermined number of P/E cycles, for example, 10000 P/E cycles or 20000 P/E cycles.

At a step 102, a sector with minimum ECN (P/E cycles) is identified in the memory array, for example a sector M.

At a step 104, sector E is erased.

At a step 106, the data in sector M is moved into the now erased sector E.

At a step 108, sector M is erased.

At a step 110, the physical address of sectors M and E are swapped. Data which is addressed to sector M will now be written from now on to sector E and data addressed to sector E will now be written from now on to sector M. At a step 112, the wear-leveling algorithm ends. The algorithm may be reinitiated any time a sector is to be erased and a cycle counter of the sector reaches a pre-determined level associated with a requisite for swapping.

SUMMARY OF THE PRESENT INVENTION

There is provided, according to an embodiment of the present invention, a method of restoring an ECC syndrome in a non-volatile memory device having memory cells arranged in a plurality of sectors within a memory cell array, the method comprising identifying a first sector including at least one page having a disabled ECC (error correction code) flag; reading the value of all data bits in the at least one page; calculating values for ECC bits in the at least one page; and writing the data bit values and the calculated ECC bit values to a second sector in the memory cell array.

In some exemplary embodiments, the method further comprises reading all pages in the first sector; identifying all pages having disabled ECC flags; for all other pages in the first sector having disabled ECC flags reading the value of all data bits in each one of the all other pages; calculating values for ECC bits in each one of the all other pages; and writing the data bit values and the calculated ECC bit values to the second sector.

In some exemplary embodiments, the method further comprises identifying in the first sector all pages having an enabled ECC flag; reading the values of all data bits and ECC bits in the pages having an enabled ECC flag; correcting any incorrect data bit values in the data bits using the ECC bits; and writing the data bit values including corrected data bit values and the ECC bit values in the pages having an enabled ECC flag to the second sector.

In some exemplary embodiments, the method further comprises erasing the first sector.

In some exemplary embodiments, the method further comprises erasing the second sector prior to writing the data bit values and the calculated ECC bit values from the first sector.

In some exemplary embodiments, the method further comprises swapping the physical addresses of the first and second sectors.

There is provided, according to an embodiment of the present invention, a method for performing a program-on-program operation on a page in a memory cell array of a non-volatile memory device comprising reading the page; rewriting the page with a different value for at least one of the data bits in the page; disabling an ECC flag in the page; and setting a flag indicative of a sector comprising the page with the disabled ECC flag.

There is provided, according to an embodiment of the present invention, a non-volatile memory device comprising a memory cell array including memory cells distributed among a plurality of sectors; and a controller operable to program, read, and erase memory cells in the memory array, the controller further operable to set an indicator flag in at least one sector of the plurality of sectors when rewriting a page in the at least one sector with a different value for at least one of the data bits in the page, the flag being indicative of the at least one sector being an unprotected sector.

In some exemplary embodiments, the controller is further operable to identify the first sector having a disabled ECC (error correction code) flag; read the value of all data bits in the page; calculate values for all ECC bits in the page; and write the data bit values and the calculated ECC bit values to a second sector in the memory cell array.

There is provided, according to an embodiment of the present invention, a non-volatile memory device comprising memory cells arranged into a plurality of sectors, each sector in the plurality of sectors divided into pages and comprising an indicator flag to indicate that at least one page in the sector is rewritten with a different value for at least one of the data bits in the page.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that address swapping methods generally used in wear leveling algorithms may be used to restore invalidated ECC syndromes for unprotected pages in non-volatile memory devices. Applicants have further realized that the invalidated ECC syndromes may be restored using an ECC restoration algorithm which advantageously includes sector erase operations purposely initiated by a memory device user. Included in the ECC restoration algorithm is the memory device user transferring the data in the unprotected sector into an erased sector using address swapping methods and restoring the ECC syndrome in the unprotected sector in an intermediate step during the swapping.

Figure 2:
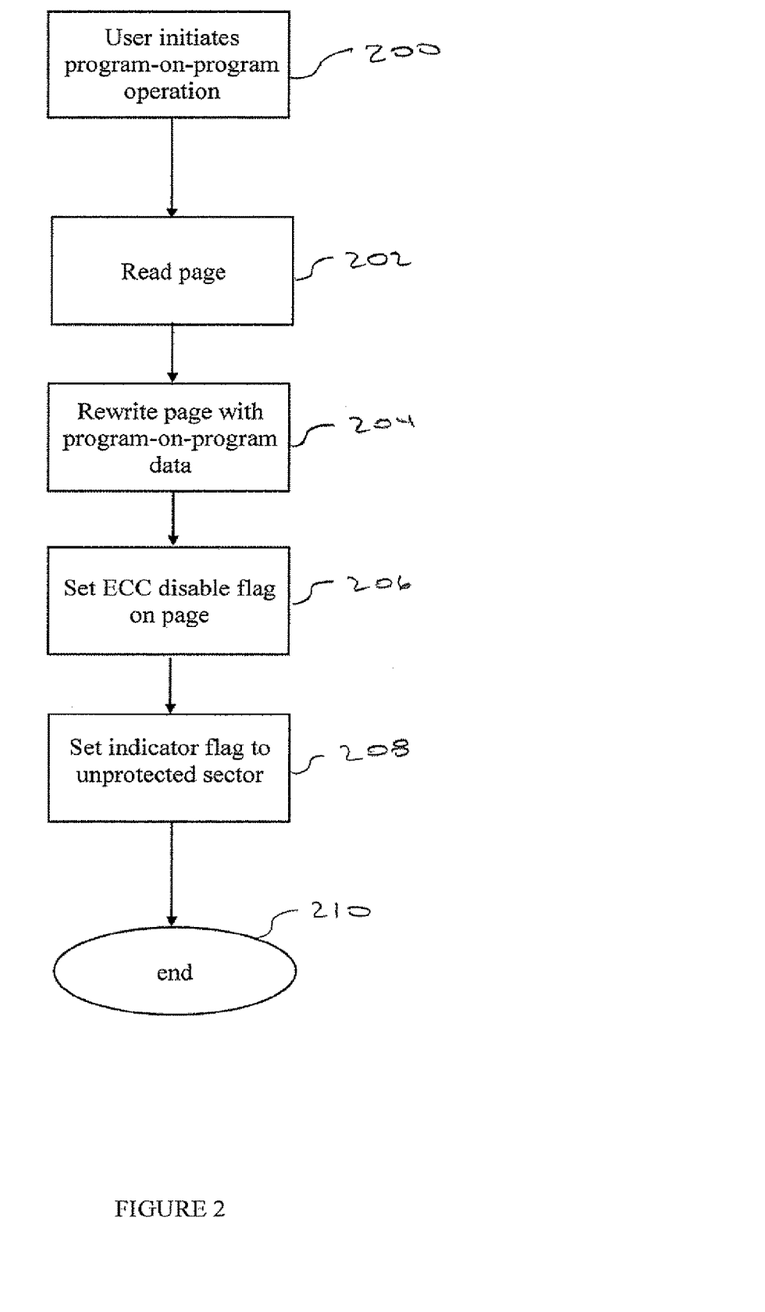
FIG. 2 is a flow chart of an exemplary program-on-program algorithm for non-volatile memory devices, according to an embodiment of the present invention.

Reference is now made to FIG. 2 which is a flow chart of an exemplary program-on-program algorithm for use in a non-volatile memory device, according to an embodiment of the present invention.

At a step 200, a command is initiated in the non-volatile memory device by a user to program a page in the device.

At a step 202, a page (or pages) in the sector which is to be programmed by the program-on-program operation is read.

At a step 204, the page is rewritten with the one or more data bits to be changed through the program-on-program operation. The ECC syndrome for the page is invalidated as a result of the one or more data bits which were overwritten by the program-on-program operation.

At a step 206, an ECC flag associated with the page is disabled. An ECC flag in the page is generally enabled (set to a state which may be associated with the data in the page being protected by the ECC syndrome) indicative the page being a protected page. The ECC flag is generally enabled following erasing of the sector and programming of the page using a standard programming operation (not program-on-program). Additionally, the ECC flag may be enabled the first time the page is programmed (when the memory device is programmed for the first time).

At a step 208, an indicator flag in the non-volatile memory device is set, indicative that the sector includes one or more unprotected pages and is an unprotected sector. The indicator flag may be located in the sector and setting of the flag is detected by an internal controller in the memory device, or by a controller externally connected to the memory device. The indicator flag may be set immediately upon detection of a first disabled ECC flag in an unprotected page in the sector. According to an embodiment of the present invention, reading the indicator flag may provide an immediate indication that the sector is an unprotected sector, thereby eliminating scanning every page in the unprotected sector to detect one or more disabled ECC flags. In some memory devices, the indicator flag may be set to an enabled state in a protected sector indicative that all ECC flags of all pages in the sector are enabled (all pages are protected). In an alternate mode, the memory device may not include indicator flags so that an unprotected sector is determined by detection of at least one disabled ECC flag associated with an unprotected page in the sector.

At a step 210, the program-on-program algorithm ends, and the memory device includes an unprotected sector.

Figure 3:
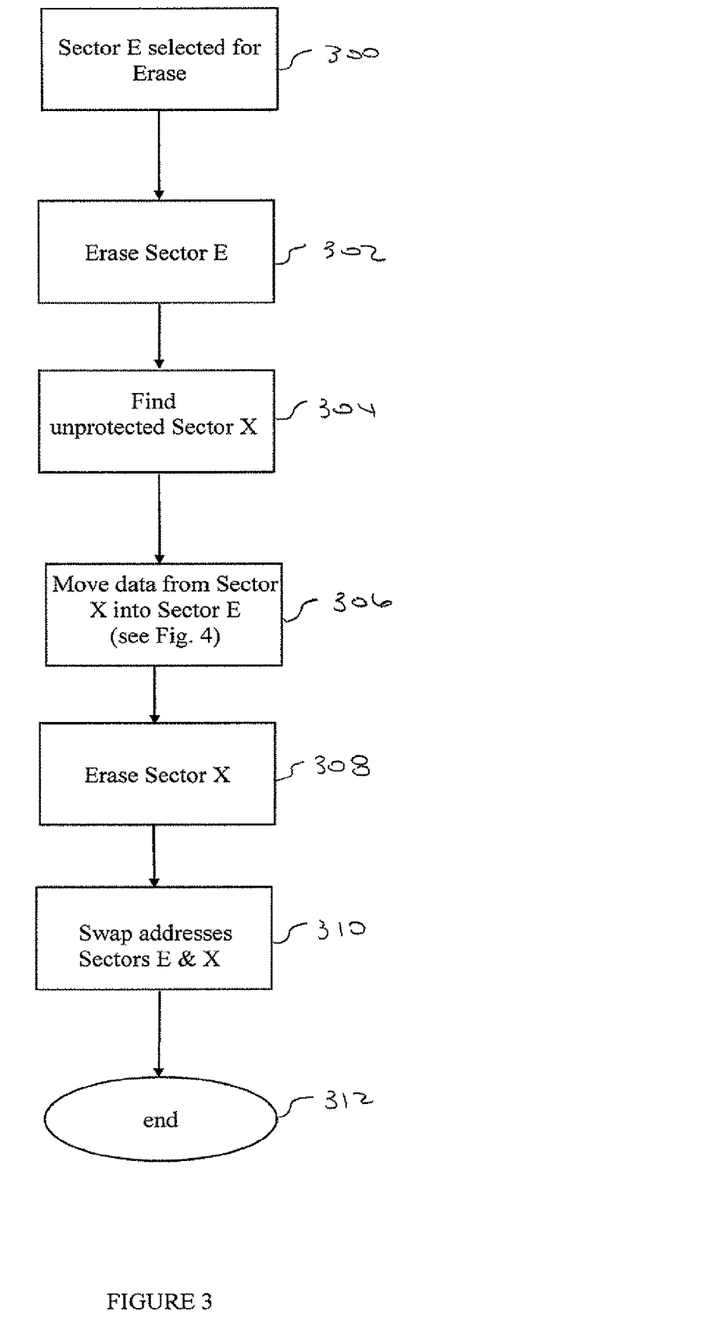
FIG. 3 is a flow chart of an ECC syndrome restoration algorithm for non-volatile memory devices, according to an embodiment of the present invention.

Reference is now made to FIG. 3 which is a flow chart of an ECC syndrome restoration algorithm for non-volatile memory devices, according to an embodiment of the present invention.

At a step 300, a sector in a memory array of the non-volatile memory device, for example a sector E, may be selected to be erased. Sector E may be selected responsive to a user erase command or alternatively, to an erase command which may be automatically initiated in the device. For example, the user may initiate the erase command in order to write new data into sector E, or responsive to detection of a wear-leveling event, or to restore ECC syndrome in an unprotected sector, among other possible reasons for erasing sector E.

At a step 302, sector E is erased

At a step 304, a search is made through the memory array to identify one or more unprotected sectors. An unprotected sector may be identified by detecting an indicator flag which is set in the sector, for example, in an unprotected sector X. Additionally or alternatively, the indicator flag may be associated with Sector X and may be set elsewhere in the memory device, or in an externally connected device. Additionally or alternatively, the unprotected sector may be identified by detecting at an ECC disabled flag in a page of in the sector.

At a step 306, the stored information in unprotected sector X may be copied to erased sector E. An exemplary data transfer algorithm for copying the data and which restores invalidated ECC syndromes in sector pages is described further on below and shown in the flow chart of FIG. 4, according to an embodiment of the present invention.

At a step 308, the data in unprotected sector X may be erased.

At a step 310, the physical-sector addresses of sectors E and X may be swapped while the logical-sector addresses are maintained (every time a request is made to read or write to sector X, the actual physical reading or writing is made to sector E; and inversely).

At a step 312, the algorithm ends and the physical-sector addresses have been swapped in the memory device.

Figure 4:
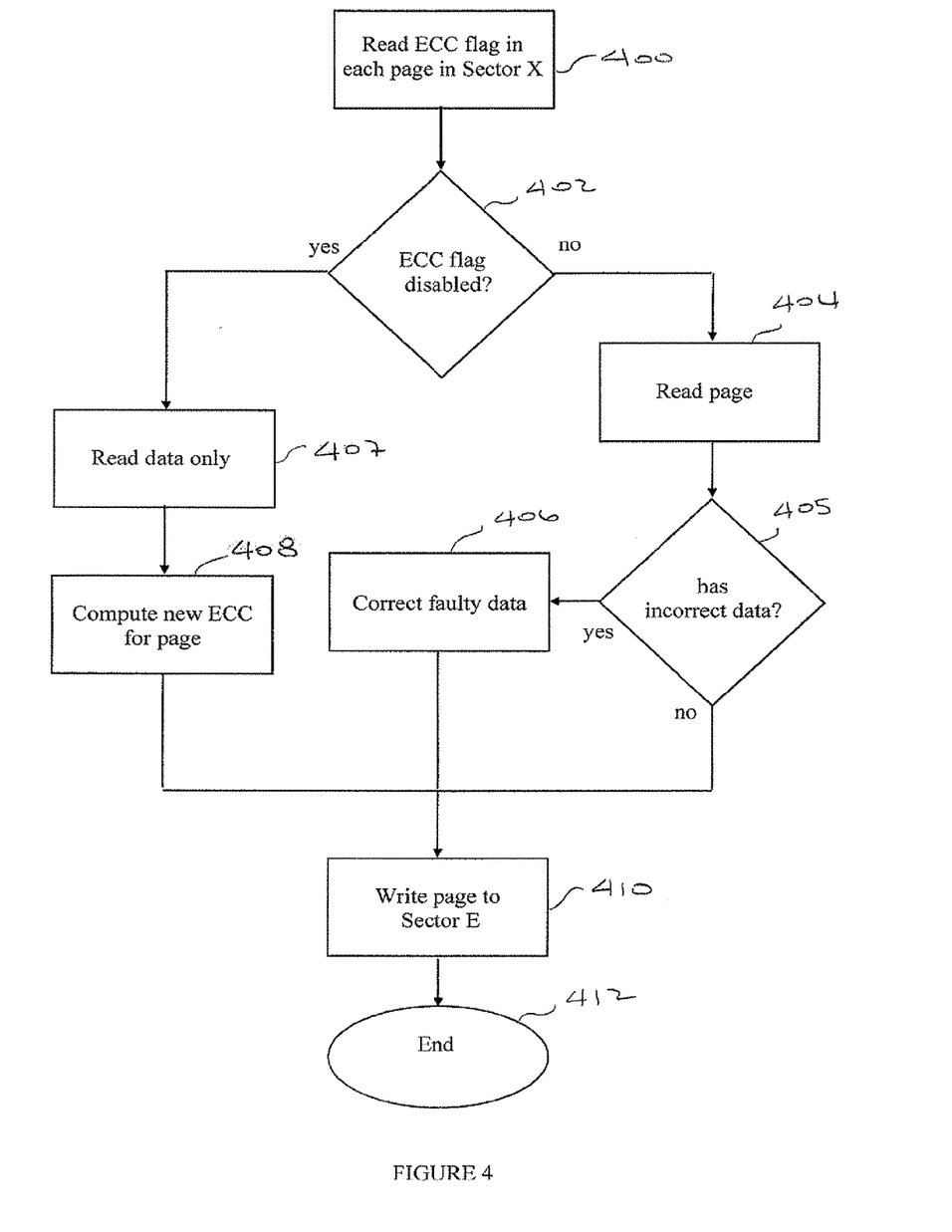
FIG. 4 is a flow chart of an exemplary algorithm for transferring data between sectors including invalidated ECC syndrome restoration, according to an exemplary embodiment of the present invention.

FIG. 4 shows a flow chart of the exemplary data transfer algorithm including invalidated ECC syndrome restoration, according to an exemplary embodiment of the present invention.

At a step 400, the ECC flag in each page in unprotected sector X is read to determine if the flag is disabled. Reading of each ECC flag may be automatically initiated in the memory device or manually initiated by the user of the device.

At a step 402, if a disabled ECC flag is detected in the page, continue to step 407. If a disabled ECC flag is not detected in the page, continue to next step 404.

At step 404, the page (having enabled ECC flag) is read. Reading includes the data bits and ECC bits.

At a step 405, if the value of one or more data bits have changed (incorrect values), continue to a step 406. If the values are correct, continue to step 410.

At a step 406, the ECC syndrome performs error correction and the incorrect value or values are corrected. All data bits now contain correct values. Continue to step 410.

At a step 407, the data bits in the unprotected page are read. The invalidated ECC bits are not read.

At a step 408, the device computes new ECC bits for the data bits read from the unprotected page.

At a step 410, the page may be copied to the new destination sector, for example sector M, whose physical-sector address was swapped with the unprotected sector X.

If the page is from step 405 or step 406, the data bits and the ECC bits as read into sector X are written into sector E. If the page is from step 408, the data bits with the newly calculated, valid ECC bits are written into sector X.

At a step 412, the algorithm ends, the data bits and valid ECC bits in the page have been moved to erased sector E. The ECC flag in the now protected (previously unprotected) page is enabled. The steps 400-412 may be repeated for each page stored in the unprotected sector X.

Figure 5:
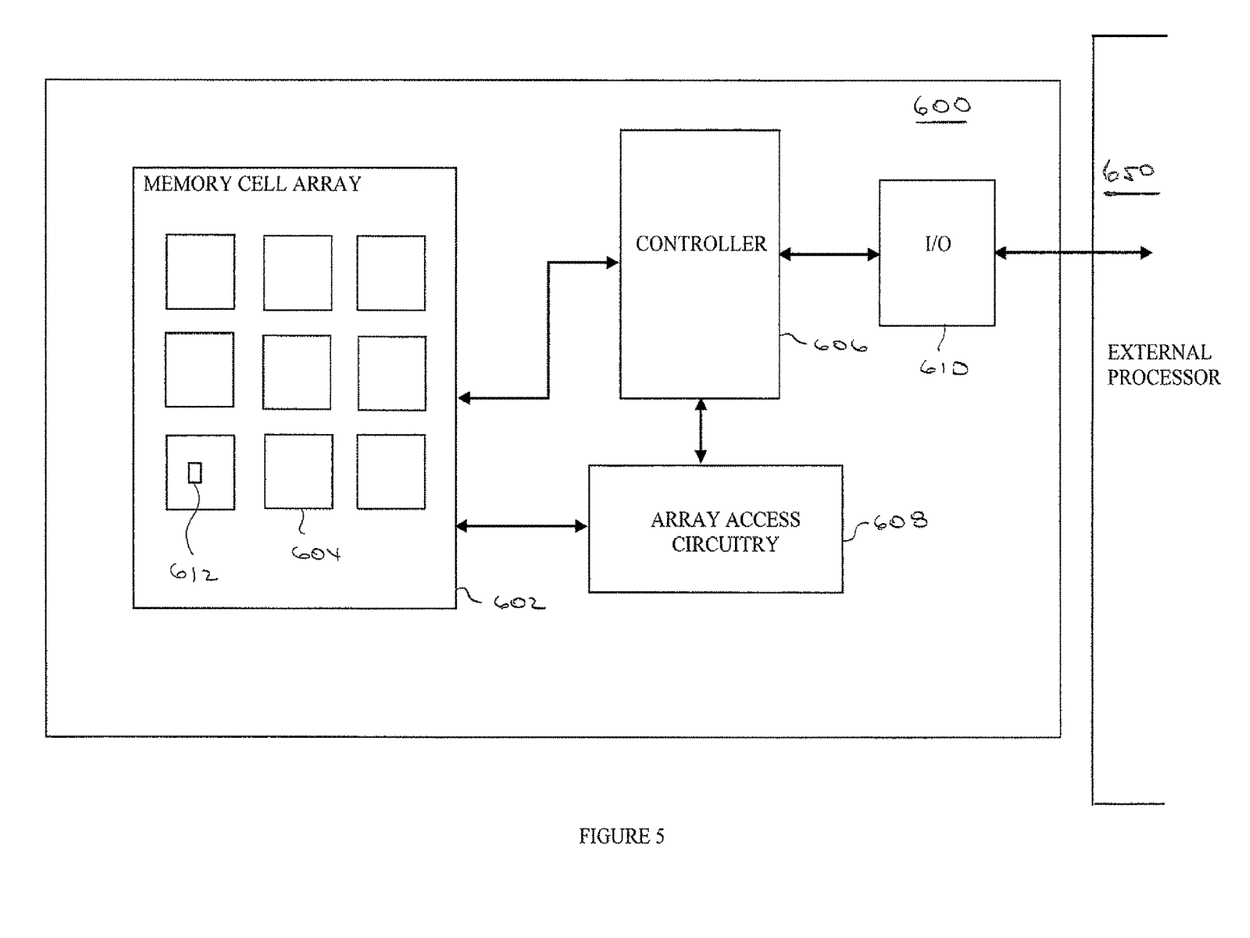
FIG. 5 schematically illustrates an improved non-volatile memory device including the ECC syndrome restoration algorithm, according to an embodiment of the present invention.

Reference is now made to FIG. 5 which schematically illustrates an exemplary improved non-volatile memory device 600 including the ECC syndrome restoration algorithm, according to an embodiment of the present invention. Memory device 600 includes a memory cell array 602, a controller 606, array access circuitry 608, and an I/O interface 610. Although memory device 600 is shown including controller 606, a skilled person may realize that memory device 600 may not include controller 606 and that memory cell array 602 may be accessed by an external processor located externally to the device for reading from, and for writing to, the memory cell array.

Memory cell array 602 may include a plurality of non-volatile memory cells equally distributed into sectors 604. The memory cells may be Mirrorbit® cells, NROM cells, or other type of memory cells, and may be configured to store one bit per cell, or alternatively, more than one bit per cell, for example 2 bits, 3 bits, 4 bits, or more. These may include data bits and error correction code (ECC) bits, the number of ECC bits may be according to a predetermined ECC Syndrome programmed in controller 606. The bits may be arranged within a sector 604 in pages 612, for example, pages of size 2 Kb (Kilobits), 4 Kb, or 8 Kb, although larger size and smaller size pages may be possible.

Controller 606 may manage all programming, reading, and erasing of the memory cells, responsive to commands which may be received through I/O interface 610 from a user connected to device 600 by means of an external processor 650, and/or commands internally programmed in the controller. Additionally, controller 606 may execute, or may manage the execution, of some or all of the steps in the previously described algorithms and shown in FIGS. 1-4. Additionally, controller 606 may manage possible data flow between memory device 600 and external processor 650 through I/O interface 610. Accessing the memory cells for programming, reading, and erasing may be through array access circuitry 608 which may include sense amplifiers, decoders, and other applicable circuitry as may be required for performing these functions. Additionally or alternatively to including controller 606 in memory device 600, the functions performed by the may be implemented through an external processor connected to the memory device.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:
1. A non-volatile memory device, comprising:
a memory cell array comprising a plurality of memory cells arranged in a plurality of sectors;
array access circuitry coupled with the memory cell array; and
a controller coupled with the memory cell array and the array access circuitry to restore an error correction code

(ECC) syndrome in the non-volatile memory device, where the controller is operatively coupled with the array access circuitry to:
  identify a first sector, of the plurality of sectors, comprising at least one page having a disabled EEC flag;
  read a data bit value of each data bit in the at least one page;
  calculate values for ECC bits in the at least one page to generate calculated EEC bit values;
  write the data bit values and the calculated ECC bit values to a second sector in the memory cell array; and
  swap a first physical address of the first sector and a second physical address of the second sector.

2. The non-volatile memory device of claim 1, wherein the controller is operatively coupled with the array access circuitry further to:
  read all pages in the first sector;
  identify all pages having disabled EED flags; and
  for all other pages in the first sector having disabled EEC flags;
    read the value of all data bits in each one of said all other pages;
    calculate values for ECC bits in each one of said all other pages; and
    write the data bit values and the calculated ECC bit values to said second sector.

3. The non-volatile memory device of claim 1, wherein the controller is operatively coupled with the array access circuitry further to:
  identify in the first sector all pages having an enabled ECC flag;
  read the values of all data bits and ECC bits in the pages having the enabled EDD flag;
  correct any incorrect data bit values in the data bits using the ECC bits; and
  write the data bit values including corrected data bit values and the ECC bit values in the pages having the enabled ECC flag to the second sector.

4. The non-volatile memory device of claim 1, wherein the controller is operatively coupled with the array access circuitry further to erase the first sector.

5. The non-volatile memory device of claim 1, wherein the controller is operatively coupled with the array access circuitry further to swap a first physical address of the first sector and a second physical address of the second sector.

6. A system, comprising:
  a non-volatile memory device comprising a memory cell array comprising a plurality of memory cells arranged in a plurality of sectors;
  a processor coupled with the non-volatile memory device to restore an error correction code (ECC) syndrome in the non-volatile memory device, where the processor is to:
    identify a first sector, of the plurality of sectors, comprising at least one page having a disabled ECC flag;
    read a data bit value of each data bit in the at least one page;
    calculate values for ECC bits in the at least one page to generate calculated ECC bit values;
    write the data bit values and the calculated ECC bit values to a second sector in the memory cell array; and
    erase the second sector prior to writing the data bit values and the calculated ECC bit values from the first sector.

7. The system of claim 6, wherein the processor is further to:
  read all pages in the first sector;
  identify all pages having disabled EEC flags; and
  for all other pages in the first sector having disabled EEC flags:
    read the value of all data bits in each one of said all other pages;
    calculate values for ECC bits in each one of said all other pages; and
    write the data bit values and the calculated ECC bit values to said second sector.

8. The system of claim 6, wherein the processor is further to:
  identify in the first sector all pages having an enabled ECC flag;
  read the values of all data bits and ECC bits in the pages having the enabled ECC flag;
  correct any incorrect data bit values in the data bits using the ECC bits; and
  write the data bit values including corrected data bit values and the ECC bit values in the pages having the enabled ECC flag to the second sector.

9. The system of claim 6, wherein the processor is further to erase the first sector.

10. The system device of claim 6, wherein the processor is further to swap a first physical address of the first sector and a second physical address of the second sector.

11. A non-volatile memory device, comprising:
  a memory cell array comprising a plurality of memory cells arranged in a plurality of sectors;
  array access circuitry coupled with the memory cell array; and
  a controller coupled with the memory cell array and the array access circuitry to restore an error correction code (ECC) syndrome in the non-volatile memory device, where the controller is operatively coupled with the array access circuitry to:
    identify a first sector comprising at least one page having a disabled flag;
    read a data bit value of each data bit in the at least one page;
    calculate values for ECC bits in the at least one page to generate calculated ECC bit values;
    write the data bit values and the calculated ECC bit values to a second sector in the memory cell array; and
    swap a first physical address of the first sector and a second physical address of the second sector.

12. The non-volatile memory device of claim 11, wherein the controller is operatively coupled with the array access circuitry further to:
  read all pages in the first sector;
  identify all pages having disabled ECC flags;
  for all other pages in the first sector having disabled ECC flags:
    read the value of all data bits in each one of said all other pages;
    calculate values for ECC bits in each one of said all other pages; and
    write the data bit values and the calculated ECC bit values to the second sector.

13. The non-volatile memory device of claim 11, wherein the controller is operatively coupled with the array access circuitry further to:
  identify in said first sector all pages having an enabled ECC flag;

read the values of all data bits and ECC bits in the pages having an enabled ECC flag;
correct any incorrect data bit values in the data bits using the ECC bits; and
write the data bit values including corrected data bit values and the ECC bit values in the pages having an enabled ECC flag to the second sector.

14. The non-volatile memory device of claim 11, wherein the controller is operatively coupled with the array access circuitry further to erase the first sector.

15. The non-volatile memory device of claim 11, wherein the controller is operatively coupled with the array access circuitry further to erase the second sector prior to write of the data bit values and the calculated ECC bit values from the first sector.

16. A system comprising:
a non-volatile memory device comprising a memory cell array comprising a plurality of memory cells arranged in a plurality of sectors;
a processor coupled with the non-volatile memory device to restore an error connection code (ECC) syndrome in the non-volatile memory device, where the processor is to:
identify a first sector comprising at least one page having a disabled flag;
read a data bit value of each data bit in the at least one page;
calculate values for ECC bits in the at least one page to generate calculated ECC bit values;
write the data bit values and the calculated ECC bit values to a second sector in the memory cell array; and
swap a first physical address of the first sector and a second physical address of the second sector.

17. The system of claim 16, wherein the processor is further to:
read all pages in the first sector;
identify all pages having disabled ECC flags;
for all other pages in the first sector having disabled ECC flags:
read the value of all data bits in each one of said all other pages;
calculate values for ECC bits in each one of said all other pages; and
write the data bit values and the calculated ECC bit values to the second sector.

18. The system of claim 16, wherein the processor is further to:
identify in said first sector all pages having an enabled ECC flag;
read the values of all data bits and ECC bits in the pages having an enabled ECC flag;
correct any incorrect data bit values in the data bits using the ECC bits; and
write the data bit values including corrected data bit values and the ECC bit values in the pages having an enabled ECC flag to the second sector.

19. The system of claim 16, wherein the processor is further to erase the first sector.

20. The system of claim 16, wherein the processor is further to erase the second sector prior to write of the data bit values and the calculated ECC bit values from the first sector.

* * * * *